(12) United States Patent
Hebras

(10) Patent No.: US 7,632,739 B2
(45) Date of Patent: Dec. 15, 2009

(54) FABRICATION OF HYBRID SUBSTRATE WITH DEFECT TRAPPING ZONE

(75) Inventor: Xavier Hebras, Grenoble (FR)

(73) Assignee: S.O.I.Tec Silicon on Insulator Technolgies, Bernin (FR)

( * ) Notice: Subject to any disclaimer, the term of this patent is extended or adjusted under 35 U.S.C. 154(b) by 60 days.

(21) Appl. No.: 11/836,527

(22) Filed: Aug. 9, 2007

(65) Prior Publication Data

US 2008/0171443 A1 Jul. 17, 2008

(30) Foreign Application Priority Data

Jan. 15, 2007 (FR) .................................. 07 00265

(51) Int. Cl.
*H01L 21/30* (2006.01)
*H01L 21/46* (2006.01)
(52) U.S. Cl. ...................... 438/456; 438/455
(58) Field of Classification Search ................. 438/455, 438/456
See application file for complete search history.

(56) References Cited

U.S. PATENT DOCUMENTS

| | | | | |
|---|---|---|---|---|
| 7,166,520 | B1 * | 1/2007 | Henley | 438/458 |
| 7,285,471 | B2 * | 10/2007 | Maleville et al. | 438/311 |
| 7,449,395 | B2 * | 11/2008 | Allibert et al. | 438/459 |
| 2003/0124265 | A1 * | 7/2003 | Bellmann et al. | 427/536 |
| 2004/0222500 | A1 * | 11/2004 | Aspar et al. | 257/629 |
| 2005/0191779 | A1 * | 9/2005 | Le Vaillant et al. | 438/24 |
| 2005/0275067 | A1 | 12/2005 | Atwater, Jr. et al. | 257/616 |
| 2006/0154442 | A1 * | 7/2006 | de Souza et al. | 438/455 |
| 2007/0104240 | A1 * | 5/2007 | Le Vaillant et al. | 372/45.011 |

FOREIGN PATENT DOCUMENTS

EP 1 571 705 A2 9/2005
FR 2 823 599 A1 10/2002

OTHER PUBLICATIONS

G.K. Celler et al., "Frontiers Of Silicon-On-Insulator", Journal of Applied Physics, vol. 93, No. 9, pp. 4955-4978 (2003).

* cited by examiner

*Primary Examiner*—Zandra Smith
*Assistant Examiner*—Jamie Niesz
(74) *Attorney, Agent, or Firm*—Winston & Strawn LLP

(57) ABSTRACT

A process for fabricating a hybrid substrate that has a defect trapping zone. The process includes the steps of forming or depositing a first insulator layer on a first substrate of semiconductor material; increasing roughness of the first insulator layer surface; depositing a second insulator layer on the roughened surface of the first insulator to form a trapping zone between the layers; bonding a second substrate onto the second insulator layer by molecular adhesion; and transferring an active layer formed by the implantation of atomic species into one of the substrates. The trapping zone is able to retain gaseous species present at the various interfaces of the hybrid substrate to limit the formation of defects on the surface of the active layer that is transferred.

24 Claims, 4 Drawing Sheets

FABRICATION OF HYBRID SUBSTRATE WITH DEFECT TRAPPING ZONE

BACKGROUND

The present invention relates to a process for fabricating a hybrid substrate that can be used in the field of optics, electronics or optoelectronics. The terms "optics", "electronics" and "optoelectronics" in general include microelectronics, nano-electronics, micro-optoelectronics, nano-optoelectronics and components technology.

A hybrid substrate is a substrate comprising at least two layers of material of the same or different nature, the term "nature" covering both the chemical nature of the material and its physicochemical properties and/or its crystalline orientation. Among these hybrid substrates are in particular those known by the acronym "SeOI", which stands for "*Semiconductor On Insulator*". Such a substrate comprises an insulator layer, for example made of oxide, buried between a generally thin layer of semiconductor material, the "active" layer, and a bulk substrate or "receiver" substrate made of semiconductor material.

In the rest of the description and the claims, the term "insulator" denotes an electrically insulating material, possibly having a high dielectric permittivity. SeOI substrates are fabricated, for example, by a process known by the trademark SMART-CUT® which typically comprises the following steps:

formation or deposition of an insulator layer on a first substrate, called a "donor" substrate, so that an interface called a "bonding" interface exists between them;

implantation of atomic species into the donor substrate so as to form a zone of weakness therein;

bonding a second substrate, called a "receiver substrate", onto the free surface of the insulator by molecular adhesion; and detachment of the rear part of the donor substrate along the zone of weakness.

In the field of microelectronics, the surface quality of the active layer of semiconductor material is of very great importance. More precisely, the roughness and the absence of surface defects on this active layer are parameters that have to be optimized so that the future components that will be produced from these SeOI substrates will be of optimum quality. Now, various types of surface defects may appear after the active layer has been transferred onto the receiver substrate. These defects are in particular:

non-transferred zones (known as NTZs);

blisters;

voids; and crystal-oriented voids or COVs.

All these defects are due to poor transfer, to the presence of underlying defects in the various layers of the hybrid substrate, to the quality of the bonding at the interface or, very simply, to the processes used to fabricate such substrates, such as, for example, the implantation of atomic species and the heat treatment. The defects present at the bonding interfaces will become sites for gas trapping during the various steps of the process and will thus swell and form voids or COVs. Thus, to give an example in the case of a hybrid substrate comprising, in succession, a silicon support substrate, covered with a thermal oxide layer, then with a tetraethylorthosilicate (TEOS) oxide layer obtained by low-pressure chemical vapor deposition (LPCVD) deposition and, finally, with a germanium active layer, the gaseous elements may have several origins. As a reminder, the term "LPCVD TEOS" will denote a silicon oxide ($SiO_2$) obtained from a TEOS precursor by a LPCVD technique.

The aforementioned gaseous elements may derive in particular:

from the hydrogen or helium supplied during the atomic species implantation step for the purpose of forming the zone of weakness, the quantity of these gaseous elements depending on the type of implanter used and on the implantation conditions (dose and energy);

from the desorption of water ($H_2O$) molecules present at the bonding interface between thermal oxide and the TEOS oxide; and from the TEOS oxide if the densification of the latter has not been sufficient, because of the diffusion of carbon compounds.

In addition, it should be noted that the smaller the thickness of the active layer, the larger the number of defects. This is because when the active layer is thick enough, defects of the blister or void type are generally retained within its thickness and consequently appear less on its surface. FIG. 4 herein provides an illustrative example of these defect problems. This is a graph representing the concentration C of $H^+$ ions per $cm^2$ as a function of the depth P expressed in nanometers in a particular hybrid substrate, the results having been obtained by secondary ion mass spectroscopy (SIMS).

More precisely, this hybrid substrate is the result of bonding between a silicon (Si) support substrate that has undergone a thermal oxidation and a germanium (Ge) donor substrate on which a layer of silicon oxide ($SiO_2$) has been deposited. The bonding interface is therefore between two oxides, one belonging to the support substrate and the other belonging to the donor substrate. In the graph of FIG. 4, the bonding interface between the two $SiO_2$ layers is located at −200 nm. The support substrate has not been shown in FIG. 4—only its linking interface with the $SiO_2$ layer is shown, and this interface is located at −400 nm.

Curve a shown as a solid line represents the results obtained in the germanium donor substrate covered with $SiO_2$ before the two substrates are bonded together and before the implantation of atomic species using the SMART-CUT® process for the purpose of forming the zone of weakness within the germanium layer. The $H^+$ ions lie mainly at the bonding interface between the $SiO_2$ first layer and the germanium layer. Curve c shown as a bold line represents the results obtained in the same substrate after the implantation for forming the zone of weakness and before the bonding to the $SiO_2$ second layer. It should be noted that the vertical line at −200 nm corresponds to an artifact. The values start only at about −200 nm as this corresponds to the implantation carried out before the bonding of the $SiO_2$ second layer. In the particular case of germanium, detachment does not take place in the region of maximum implantation, but just a little after (about 550 nm), which will explain the appearance of curve b below.

Curve b shown as a dotted line represents the results obtained after the bonding of the two $SiO_2$ layers and after detachment and transfer of the germanium active layer. The distribution of the hydrogen species shows a build-up at the $SiO_2$/Ge and $SiO_2$/support substrate bonding interface. A small peak appears at −200 nm in the $SiO_2$ layer. This corresponds to the bonding interface between the two $SiO_2$ layers.

A substantial increase in the quantity of gas is observed in the insulator ($SiO_2$) layer after the step of detaching and transferring the germanium active layer. This increase is the cause of the defects that are visible, after transfer, on the upper face of the transferred germanium layer.

In addition, in the field of semiconductors, the trend is toward ever greater miniaturization of components and reduction in their energy consumption. This supposes that the thickness of both the active layer and the buried oxide layer are reduced simultaneously. Now, reducing the thickness of these two layers also results in the appearance of defects, especially when the oxide layer has a thickness of less than 25 nm (25 nanometers) and the active layer has a thickness of less than 400 nm (400 nanometers).

Finally, among hybrid substrates are also those known by those skilled in the art as Direct Silicon Bonding (DSB) substrates. Such substrates comprise an active layer of semiconductor material directly bonded to a receiver substrate or bulk substrate, also made of semiconductor material, without the formation of an intermediate layer, especially without the formation of a buried oxide layer. The fabrication processes known at the present time for this type of DSB substrate also result in the appearance of defects when the active layer is thin.

To solve the aforementioned problems of the appearance of surface defects, the process described in US patent application no. 2002/0190269 is already known. The purpose of this process is to fabricate a hybrid substrate that comprises a germanium layer on silicon, while reducing the formation of bubbles at the bonding interface. More precisely, this substrate is obtained by implantation of hydrogen into a germanium donor substrate so as to form a zone of weakness therein, then by bonding it to a silicon receiver substrate, and finally by heat treatment to detach the rear part of the germanium substrate.

In one particular embodiment of that application, an "antibubble" layer of amorphous silicon is placed on the germanium substrate before bonding, so as to make the bonding interface hydrophilic and thus to reduce the formation of hydrogen bubbles when the germanium substrate is bonded to the silicon substrate. According to another embodiment, it is suggested to improve the roughness of the transferred germanium layer by depositing thereon a germanium buffer layer, formed by epitaxy. The purpose of these two solutions is to improve the quality of the bonding interface between the two substrates, but they require the addition of an additional layer, thereby complicating the process. Thus, improvements in these areas remain needed.

SUMMARY OF THE INVENTION

The present invention provides a process for fabricating a hybrid substrate that prevents the formation of defects on the surface of the semiconductor active layer transferred, and more precisely defects due to the build-up of gaseous elements at the various bonding interfaces of the substrate. In one particular embodiment, such a process must also be applicable to the fabrication of a hybrid substrate whose active layer has a small thickness, i.e. less than 400 nm, and whose insulator layer is less than 5 nm, or even nonexistent.

The invention also dispenses with the deposition of intermediate layers (amorphous layers or buffer layers) that are deposited or inserted between the insulator layer and the active layer, as is the case according to the processes known in the prior art. The reason for this is that such layers are liable to modify the electrical properties of the final structure.

For this purpose, the invention relates to a process for fabricating a hybrid substrate that can be used in the fields of optics, electronics or optoelectronics. This process comprises providing a first insulator layer on a first substrate of semiconductor material, the layer having an exposed surface; forming a roughened surface on the first insulator layer; providing a second insulator layer of semiconductor material on the roughened surface of the first insulator layer to form a trapping zone at an interface between the layers; bonding a second substrate onto the second insulator layer by molecular adhesion, wherein one of the substrates includes a zone of weakness therein formed by implantation of atomic species and defining an active layer; and transferring the active layer by detachment at the zone of weakness to form the hybrid substrate. Advantageously, the roughened surface of the first substrate forms a trapping zone that is capable of retaining gaseous atomic species present at the interface of the layers to reduce formation of defects on the surface of the active layer that is transferred.

Preferably, the first substrate is a donor wafer that includes the active layer and the providing of the first insulator layer is achieved by forming or depositing the layer upon the donor wafer. The roughened surface is preferably formed to have a minimum RMS roughness of at least 10 nm over a scan area measuring 40 μm×40 μm and wherein the first insulator layer is formed or deposited so as to have a thickness at least equal to 10 times the value of this minimum roughness. These roughnesses are obtained by chemical etching or gas plasma treatments as disclosed herein.

Other features and advantages of the invention will become apparent from the description that will now be given with reference to the appended drawings, which show, by way of indication but implying no restriction, several possible embodiments thereof.

DETAILED DESCRIPTION OF THE PREFERRED EMBODIMENTS

Figure 1A:
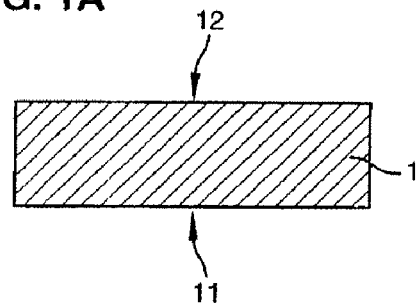
FIGS. 1A to 1G are diagrams showing the various successive steps of a first embodiment of the fabrication process according to the invention.

In particular, the process comprises the following steps:
a) forming or depositing a first insulator layer (2) on a first substrate chosen from two substrates referred to as "donor" substrate and "receiver" substrate respectively, which are made of semiconductor material;
b) carrying out a treatment for increasing the roughness of the free surface of the first insulator layer;
c) depositing a second insulator layer on the roughened first insulator layer so as to form, between them, a zone called a "trapping" zone;
d) bonding the substrate that has not been used in step a) onto the second insulator layer by molecular adhesion (wafer bonding); and
e) transferring a layer called an "active" layer by detaching it from the donor substrate along a zone of weakness formed within this substrate by the implantation of atomic species, the trapping zone being able to retain the gaseous species possibly present at the various interfaces of the hybrid substrate and to limit the formation of defects on the surface of the active layer.

According to other advantageous but nonlimiting features of the invention, taken separately or in combination:

step b) is carried out so that the minimum RMS roughness of the free surface of the first insulator layer is at least 10 nm over a scan area measuring 40 μm×40 μm and wherein the first insulator layer is formed or deposited so as to have a thickness at least equal to 10 times the value of this minimum roughness;

the roughening of the first insulator layer is carried out by chemical etching, for example using a standard cleaning solution 1 comprising a mixture of ammonium hydroxide ($NH_4OH$), hydrogen peroxide ($H_2O_2$) and deionized water or using a solution of hydrofluoric acid (HF);

the first insulator layer is roughened by subjecting it to a treatment in a gas plasma containing at least one of the following gases selected from $C_xF_y$, $S_xF_y$, $C_xH_y$, carbon monoxide (CO), hydrogen, argon, chlorinated species of the $BCl_3$ type or mixtures thereof, possibly in the presence of oxygen and/or nitrogen, so as to create partial polymerization reactions on its surface;

the density of this plasma is between about $10^7$ at/$cm^3$ and $10^{13}$ at/$cm^3$;

the second insulator layer is densified by a heat treatment at at least 800° C. for at least one hour;

the first insulator layer is formed or deposited on the donor substrate and the step of implanting atomic species, intended to form the zone of weakness, is carried out after the first insulator layer has been deposited or formed, the roughening of the first insulator layer possibly taking place before or after this implantation; preferably, the step of implanting atomic species is carried out after the second insulator layer has been deposited;

the insulator constituting the first and/or second insulator layer is an oxide;

the insulator of the first insulator layer is an oxide obtained by thermal oxidation of the first substrate or a native oxide;

the insulator of the first and/or second insulator layer is a silicon oxide ($SiO_2$) obtained by LPCVD (low-pressure chemical vapor deposition) from the precursor tetraethylorthosilicate (TEOS);

the techniques for depositing the insulator layer are chosen from CVD (chemical vapor deposition) or LPCVD (low-pressure chemical vapor deposition) techniques; and the insulator constituting the first and/or second insulator layer is a nitride.

According to one embodiment, the insulator constituting the first and second insulator layers is an oxide of the semiconductor material constituting the active layer, the active layer has a predetermined thickness and, after step e), the hybrid substrate is heated in an inert and/or reducing atmosphere at a predetermined temperature for a predetermined time, the predetermined thickness, predetermined temperature and predetermined time being chosen so as to make a quantity of oxygen of the oxide layer diffuse through the active layer rather than through the receiver substrate, so that the thickness of the oxide layer is reduced by a predetermined amount.

In this case, other features of the invention, taken separately or in combination, include:

the thickness of the active layer is between about 25 nanometers and about 500 nanometers, the predetermined temperature is about 1200° C. and the predetermined time is between 5 minutes and 5 hours;

the total thickness of the first and second insulator layers is between 1 nm and 50 nm;

the predetermined thickness of the active layer and the predetermined temperature are chosen so as to have an average rate of reduction of the oxide layers of about 0.05 nm per minute;

the heating is continued until the first and second oxide layers have been completely removed; and the insulator is silicon oxide ($SiO_2$) and the donor substrate and receiver substrate are made of silicon (Si).

A first embodiment of the process according to the invention will now be described with reference to FIGS. 1A to 1G.

FIG. 1A shows a substrate 1 called a "donor" substrate, as this is the one which provides the active layer in the hybrid substrate to be obtained.

The donor substrate 1 has two opposed faces 11 and 12, called "rear" and "front" faces respectively. It may be a monolayer or multilayer substrate. As an example of a multilayer donor substrate, it is possible to use a bulk substrate coated with an epitaxially grown layer, such as a bulk silicon substrate coated with an epitaxially grown germanium layer.

Figure 1B:
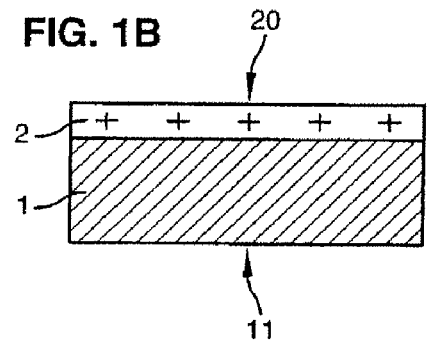

The donor substrate 1 consists at least partly of a semiconductor material, more precisely one of those commonly used in the electronics field, especially silicon. The donor substrate 1 may also be, for example, made of germanium (Ge), gallium nitride (GaN), gallium arsenide (GaAs) or silicon-germanium (SiGe). As shown in FIG. 1B, a first insulator layer 2 is then formed or deposited on the front face 12 of the substrate 1. The insulator layer 2 has a free surface 20.

The insulator constituting the layer 2 is preferably an oxide of a semiconductor material, for example a silicon dioxide ($SiO_2$). It may also be a nitride or oxynitride of a semiconductor material, for example silicon nitride ($Si_3N_4$) or germanium oxynitride ($Ge_xO_yN_z$). It is also possible to use for the layer 2 dielectric materials having a high permittivity ("high-k" materials) such as, for example, hafnium dioxide ($HfO_2$), alumina ($Al_2O_3$), zirconium oxide ($ZrO_2$), tantalum pentoxide ($Ta_2O_5$), titanium dioxide ($TiO_2$), their nitrides and their silicides.

When the insulator layer 2 is formed, it is formed by thermal oxidation of the source substrate 1. In this case, the insulator layer 2 is an oxide of the constituent semiconductor material of the front face 12 of the substrate 1. This technique is simple to employ, but makes the nature of the insulator 2 dependent on that of the substrate 1 or on part of the substrate 1 if this is a multilayer substrate.

To give an example, a layer of silicon oxide ($SiO_2$) may be obtained by a heat treatment in oxygen of a silicon substrate at a temperature of 900° C. for a time of 30 minutes until the desired thickness, as will be described later, has been obtained.

The insulator layer 2 may also be deposited. This enables its chemical nature not to be dependent on the substrate 1. Thus, it will be possible, for example, to deposit a layer of $SiO_2$ on a substrate made of germanium or silicon carbide (SiC). Among deposition techniques, mention may be made of chemical vapor deposition or CVD. It is also possible to use low-pressure chemical vapor deposition or LPCVD, or an atomic layer deposition (ALD) process.

If the insulator layer 2 is an $SiO_2$ layer, it is also possible to deposit it by the aforementioned LPCVD technique, but using a tetraethylorthosilicate (TEOS) precursor, this technique being known as LPCVD TEOS. To do this, tetraethylorthosilicate ($Si(OC_2H_5)_4$) is introduced in gaseous form into the chamber of the chemical deposition reactor. Under the action of temperature and pressure, the compound decomposes as follows:

$$Si(OC_2H_5)_4(gas) \rightarrow SiO_2(solid) + 2C_2H_4(gas) + 2CH_3CH_2OH(gas).$$

To give an example, it is possible to obtain an $SiO_2$ thickness of between 50 nm and 200 m by keeping the pressure inside the chamber between 200 mtorr (millitorr) and 1 torr (i.e. between 26.6 Pa and 133.3 Pa) and the temperature between 600° C. and 750° C. for a time ranging from about 5 to 30 minutes.

Figure 1C:
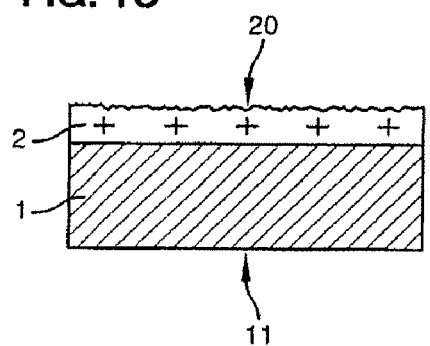
Figure 1D:
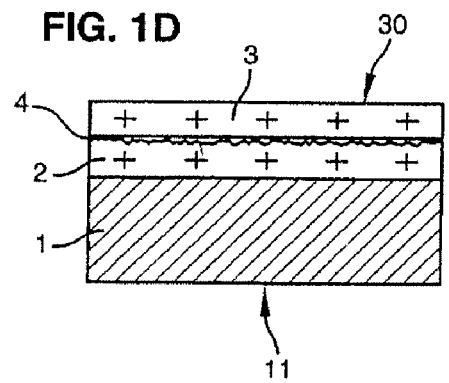

As shown in FIGS. 1C and 1D, a step of roughening the free surface 20 of the layer 2 is then carried out, followed by deposition thereon of a second insulator layer 3 so as to form a zone 4 called a "trapping" zone between these two insulator layers 2 and 3. The free surface of the second insulator layer 3 bears the numerical reference 30. The list of materials constituting the second insulator layer 3 is the same as that mentioned above in the case of the insulator layer 2. The insulating materials constituting the layers 2 and 3 may be of the same or different nature—the term "nature" is understood to mean both the chemical composition of the material and its physicochemical properties, for example the density.

To give an example, the layers 2 and 3 may have the same chemical composition but the layer 3 has been obtained by deposition whereas the layer 2 has been obtained by thermal oxidation. Consequently, the layer 3 is less dense and trapping of the gaseous species also takes place therein, in addition to the trapping that occurs in the trapping zone 4.

Another example relates to the use of a layer 2 and a layer 3 that have different chemical compositions, the layer 3 having been deposited and therefore having a lower density than that of the layer 2. In this case, a segregation phenomenon may be observed at the interfaces between the various layers, since the atoms that pass through the two insulator layers differ in behavior according to their limiting solubilities, which are different in these two layers. If certain gaseous species are blocked by one of the layers 2 or 3, they will for example be more strongly retained in the trapping zone 4.

The second insulator layer 3 is preferably obtained only by deposition, as if it were to be formed by a heat treatment this would run the risk of modifying the roughness obtained beforehand on the free surface 20 of the layer 2. Finally, it should be noted that deposition allows a second insulator layer to be obtained with a lower density than the layer 2, therefore implying better trapping of the species, since a lower density leads to the formation of a larger number of dangling bonds within the insulator. Thus, for an insulator layer made of $SiO_2$ for example, hydrogen atoms will form covalent bonds with oxygen and/or silicon. The deposition techniques used to deposit the second insulator layer 3 may be chosen from the same as those mentioned above in the case of the insulator layer 2.

The purpose of the roughening treatment is to modify the surface state of the face 20 sufficiently to form a trapping zone 4 that can retain the gaseous species possibly present at the various interfaces of the hybrid substrate 6 to be obtained (see FIG. 1G) and limit the formation of surface defects on its transferred active layer 14. The roughness may be expressed by an RMS (Root Mean Square) value. The roughness measurements may in particular be made using an atomic force microscope or AFM. To obtain the desired effect of forming a trapping layer 4, it is preferable for the insulator layer 2 to have a minimum RMS surface roughness of at least 10 nm (10 nanometers) for a scan area of 40 µm×40 µm under the AFM microscope beam. This roughness is sufficiently large for the cavities formed in the surface 20 of the layer 2 not to be filled during deposition of the second insulator layer 3.

It should be noted that if the roughening treatment may in certain cases have the effect of reducing the thickness of the insulator layer 2, this will preferably have a minimum thickness such that a sufficient insulator thickness remains even after the roughening treatment. Preferably, it is necessary to have a minimum thickness of the first insulator layer 2 before etching equal to at least 10 times the value expressed in nanometers of the RMS roughness that it is desired to obtain on this layer. Thus, to obtain an RMS roughness of 10 nanometers for a scan area of 40 µm×40 µm, it is preferable for the insulator layer 2 to have a minimum thickness of 100 nanometers.

The roughening may for example be carried out by chemical etching or by a treatment in a particular plasma. According to a first alternative embodiment, the chemical etching is carried out by immersing the substrate 1, covered with the insulator layer 2, in a bath of a solution known to those skilled in the art as SC1 (Standard Clean 1) which comprises a mixture of ammonium hydroxide ($NH_4OH$), hydrogen peroxide ($H_2O_2$) and deionized water. It is also possible to use a chemical etching solution based on hydrofluoric acid (HF) diluted in water between 0.1 and 50 vol %. Whatever the etching treatments, they will be applied for 1 to 100 seconds within a temperature range from 20° C. to 70° C. in order to obtain etched thicknesses of 2 to 80 nm. In the two aforementioned techniques, the longer the contact time with the etching solution, the deeper the etching of the insulator layer 2 and the greater its roughness.

The plasma treatment consists in placing the substrate covered with the insulator layer 2 in a plasma furnace in which a plasma is formed from a gas or gas mixture under particular temperature and pressure conditions. These conditions are adapted according to the type of plasma that it is desired to obtain and according to the layer treated. The purpose of this plasma treatment is to create partial polymerization reactions on the surface of the first insulator layer 2. More precisely, when a first species in the plasma forms a weak bond at the surface 20 of the insulator, other species will subsequently be polymerized with the first, so that polymerized zones of micromasking of the free surface 20 are created locally. On the scale of one micron, this amounts to locally increasing the roughness of the insulator. This polymerization reaction takes place over a few minutes.

The gases that may be used to form the plasma are preferably chosen from: fluorocarbon gases $C_xF_y$, such as for example $CF_4$, $C_4F_8$ and $CF_6$; sulfur fluoride gases of the $S_xF_y$ type, such as $SF_6$ or $SH_3F$; hydrocarbon gases of the $C_xH_y$ type; and also carbon monoxide (CO), $NF_3$, hydrogen, argon, chlorinated species of the $BCl_3$ type or mixtures thereof, and possibly in the presence of oxygen and/or nitrogen. The gases will be chosen according to the chemical nature of the insulator layer 2, so as to be able to polymerize on the surface of this insulator. The quantity of atomic species introduced, and therefore the implantation dose, will depend on the time during which the insulator 2 is exposed to the plasma. The longer this time, the greater the quantity of atoms introduced into the insulator 2. The implantation energy also has an impact on the depth at which these atomic species will be introduced. The type of reactor in which the plasma is formed, the choice of implanted species and the pressure within this reactor also have an influence on the density of the plasma formed. In the particular case of the invention, and for the purpose of obtaining the desired roughness, a moderate or even high density of atoms, that is to say a density between $10^7$ at/cm$^3$ and $10^{13}$ at/cm$^3$, is preferably used.

In the particular case in which the insulator layer 2 is an oxide layer, the use of a plasma has the benefit of introducing chemical species at the surface that are highly reactive with hydrogen, for example gases providing oxygen. In the particular case of oxygen implantation, the implantation energy will preferably be between 100 eV and 2000 eV for implantation doses ranging from $1\times10^{12}$ $O^+/cm^2$ to $1\times10^{16}$ $O^+/cm^2$.

Figure 5:
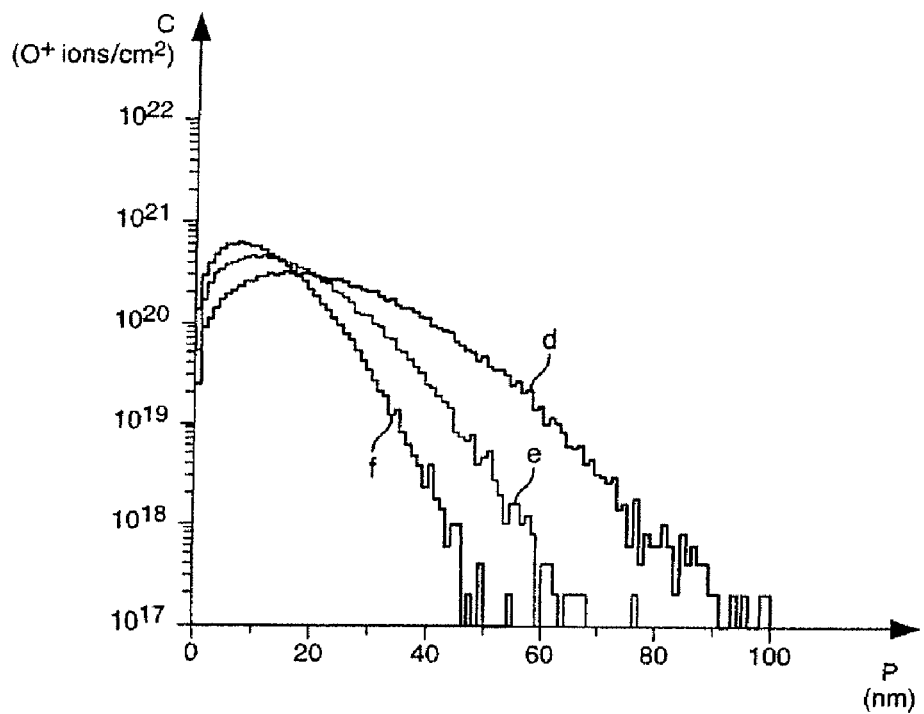
FIG. 5 shows the concentration of $O^+$ ions per $cm^3$ as a function of their depth of implantation within a silicon dioxide ($SiO_2$) layer for various implantation energies.

Trials carried out in an insulator layer of the silicon dioxide ($SiO_2$) type gave the results shown in FIG. 5. This graph illustrates the concentration of $O^+$ ions per $cm^2$ as a function of the implantation depth within the $SiO_2$, this depth being expressed in nanometers. Curves d, e and f correspond to the results obtained for $O^+$ ion implantations performed with energies of 500 eV, 300 eV and 200 eV respectively. In all cases, the implantation dose was $1\times10^{14}$ $O^+/cm^2$. It may be seen that the higher the implantation energy, the deeper the ions penetrate into the insulator.

Moreover, it is possible, optionally, to carry out a densification step on the second insulator layer 3 by subjecting the multilayer stack of FIG. 1D to a heat treatment at about 800° C. for 1 hour. The purpose of the step of densifying the insulator layer 3 is to limit the localization of the trapping at the trapping layer 4. However, if the layer 3 is not densified, it also plays a role of trapping the gaseous species.

Figure 1E:
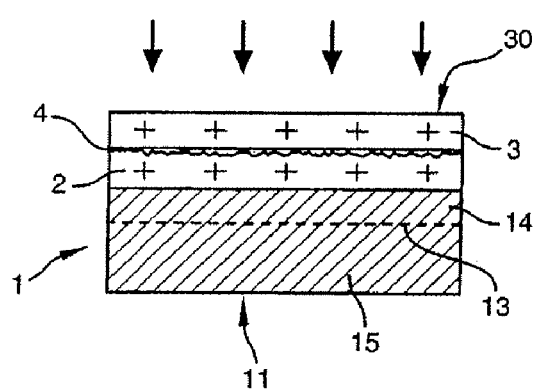

Referring to FIG. 1E, it can be seen that the process then continues with a step of implanting atomic species into one of the substrates. Typically, this is the source substrate 1 and the atomic species are introduced through insulator layers 2 and 3. The expression "implantation of atomic species" is understood to mean any bombardment of atomic or ionic species that can introduce these species into the implanted substrate with a maximum concentration of implanted species at a predetermined depth of the substrate relative to the bombarded surface. The purpose of this implantation is to form a zone of weakness 13, which forms a boundary separating an active zone 14 from the rest 15 of the substrate. The aforementioned implantation may be carried out in accordance with one of the steps of the process known by the trade name SMART-CUT®. Further details relating to this process, which is known per se to the skilled person, can be found in a document by G. Celler, Frontiers of Silicon-on-Insulator, Journal of Applied Physics, Vol. 93, no. 9, May 1, 2003, pages 4955-4978.

It should be noted that the zone of weakness 13 may optionally be formed before the formation or deposition of the first insulator layer 2. Preferably, the zone 13 is formed by implementation after formation or deposition of the layer 2, but before deposition of the insulator layer 3, it being possible for the insulator layer 2 to be roughened before or after the implantation. Also preferably, the implantation for the purpose of forming the zone 13 is carried out, as shown in the figures, that is to say after the second insulator layer 3 has been deposited. This avoids limiting thermal budget applied during deposition of this layer 3, since, as the zone of weakness has not yet been formed, there is no risk of causing premature detachment of the active layer along this zone.

Figure 1F:
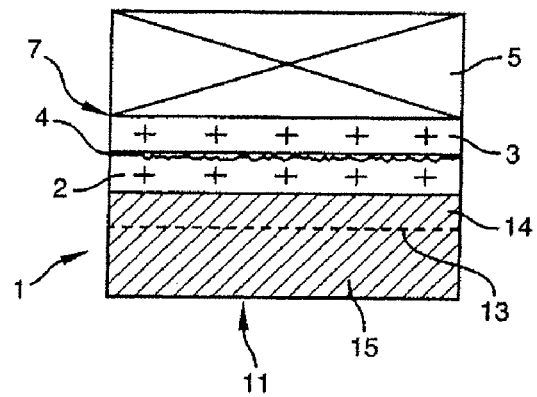
Figure 1G:
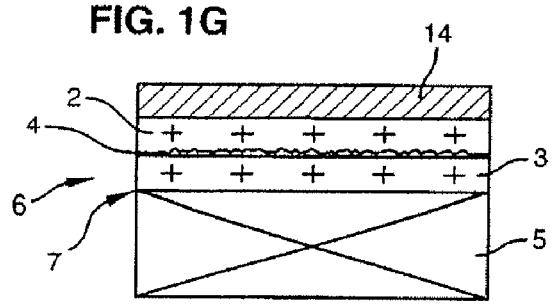

As shown in FIGS. 1F and 1G, the active layer 14 is then detached and transferred onto a receiver substrate 5 so as to obtain a hybrid substrate 6. The receiver substrate 5 may be a monolayer or multilayer substrate. As an example of a multilayer substrate, an SOI-substrate may be mentioned, so as to obtain a double SOI. To do this, the receiver substrate is bonded by molecular adhesion onto the free surface 30 of the second insulator layer 3 and then the layer 14 is detached along the zone of weakness 13 by applying mechanical, thermal and/or chemical stresses, using techniques known to those skilled in the art. The bonding interface bears the reference 7.

A second embodiment will now be described with reference to FIGS. 2A to 2F. According to this embodiment, the successive insulator layers 2 and 3 are deposited on the front face of the receiver substrate 5 instead of the front face of the donor substrate 1. The rear and front faces of the substrate 5 bear the references 51 and 52 respectively. The choice of insulating materials constituting the layers 2 and 3 and the techniques for forming or depositing the layers 2 and 3 are identical to those described above. The same applies to the roughening techniques. The same elements bear the same numerical references.

Figure 2A:
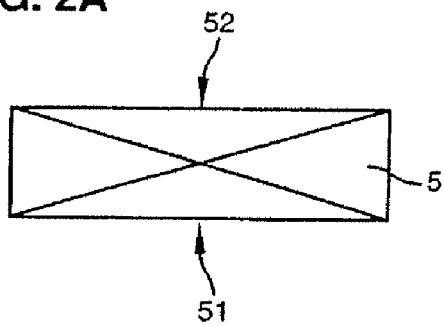
FIGS. 2A to 2F are diagrams showing the various successive steps of a second embodiment of the fabrication process according to the invention.
Figure 2B:
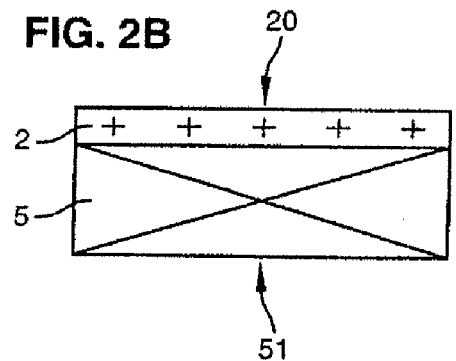
Figure 2C:
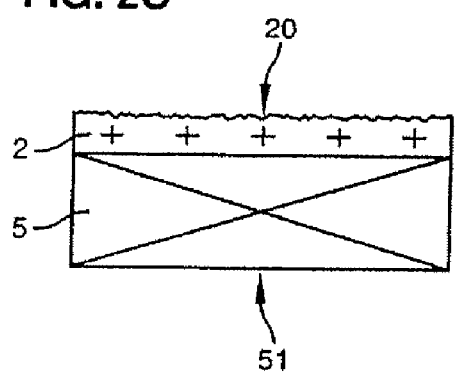
Figure 2D:
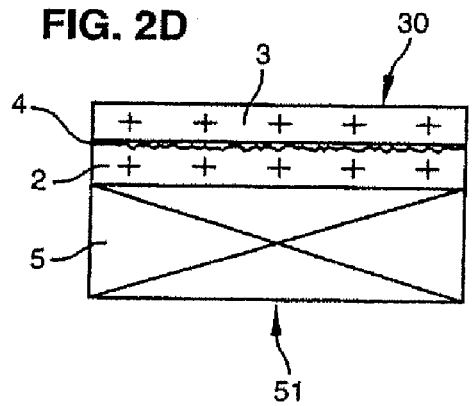
Figure 2E:
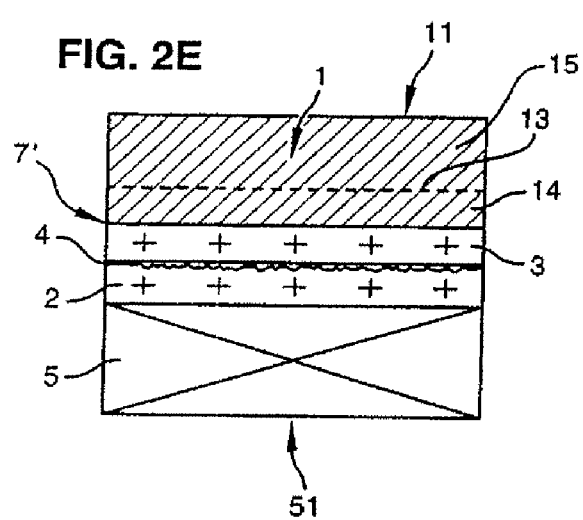

FIG. 2E shows that the source substrate 1 has undergone the step of atomic species implantation, allowing the zone of weakness 13 to be formed, before being bonded by molecular adhesion onto the insulator layer 3. To do this, the source substrate 1 may optionally be temporarily covered with an oxide layer making it easier to implement the aforementioned SMART-CUT® process, this oxide layer being able to be removed before bonding onto the insulator layer 3.

Figure 2F:
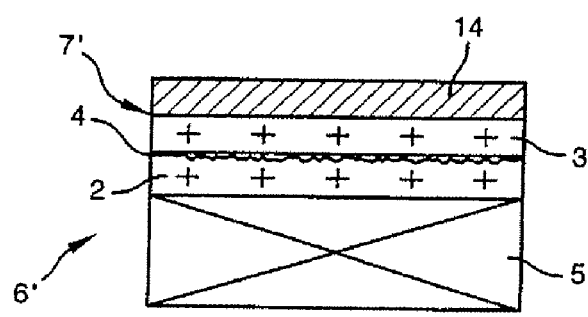

A hybrid substrate 6' is obtained, as shown in FIG. 2F, which differs from the substrate 6 in that the active layer 14 is in contact with the second insulator layer 3 and not with the first insulator layer 2, as was the case in the first process described above. The bonding interface bears the reference 7'. The trapping layer 4 formed within the hybrid substrates 6 or 6' advantageously makes it possible to trap the gaseous species which result from the implantation of atomic species, for the purpose of forming the zone of weakness 13, or which appear at the bonding interface 7 or 7', or when detaching the active layer 14.

The hybrid substrate 6 also has the following advantages over the substrate 6'. Since the implantation intended to form the zone of weakness 13 is carried out through the trapping zone 4, the gaseous species that do not participate in the formation of the zone of weakness 13 may be trapped directly in the trapping zone 4, something which is not the case with the substrate 6'. In addition, during the consolidation annealing treatments carried out after detachment, the trapping of the gaseous species is slightly more effective with the hybrid substrate 6, as these do not have the bonding interface 7' to pass through as is the case with the substrate 6'.

Figure 3A:
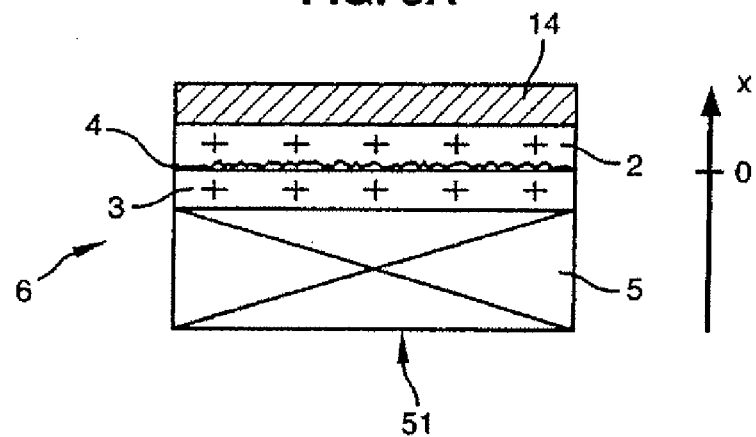
FIGS. 3A to 3C are diagrams showing an alternative embodiment of the two aforementioned processes.
Figure 3B:
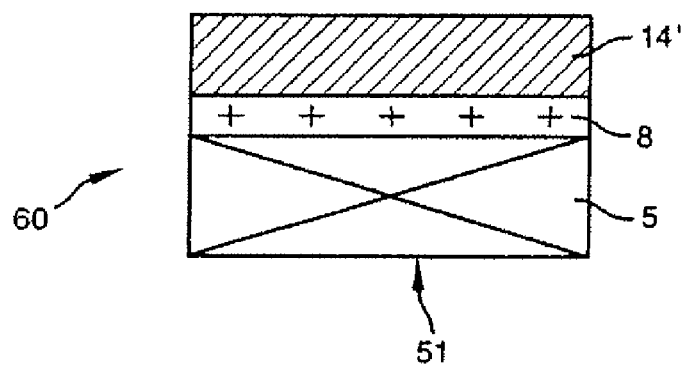
Figure 3C:
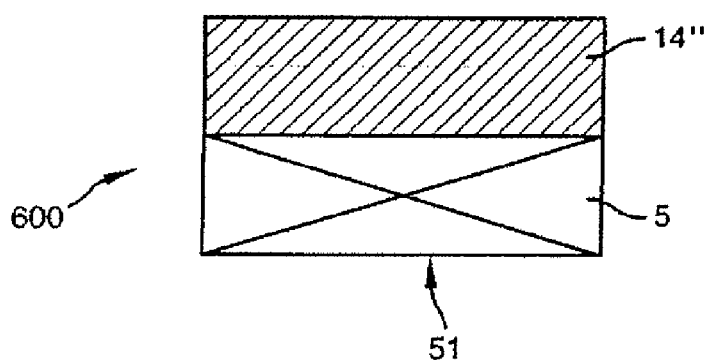
Figure 4:
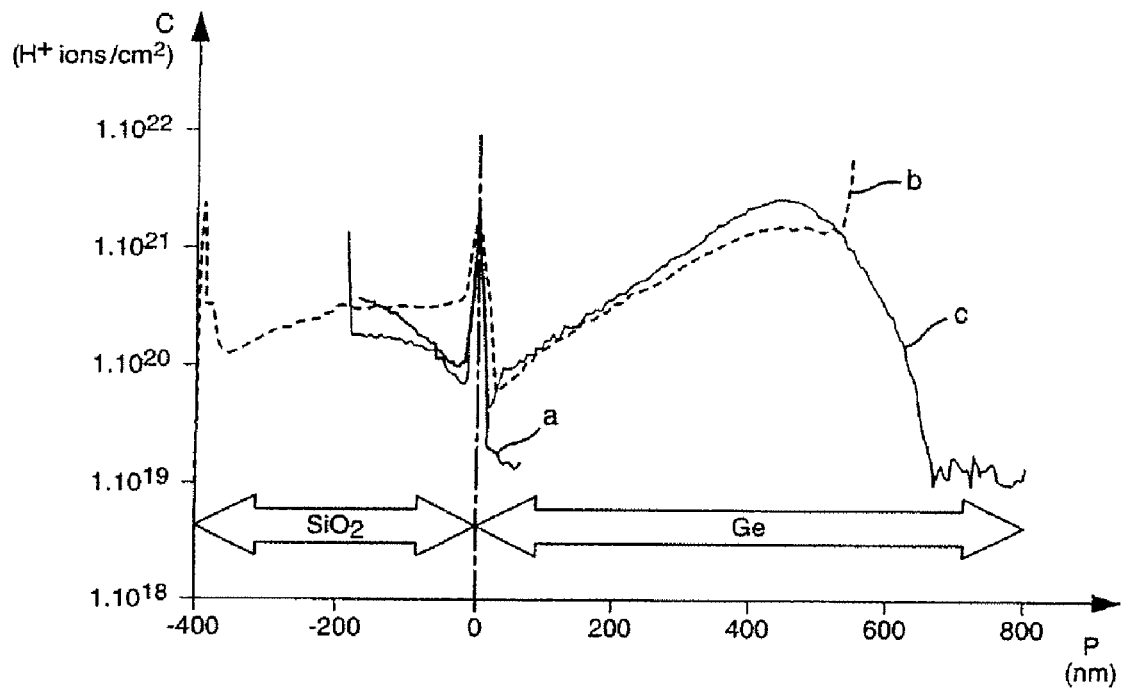
FIG. 4 is a graph showing the concentration C of $H^+$ ions per $cm^2$ as a function of the depth P into a composite substrate resulting from bonding a silicon support substrate that has undergone a thermal oxidation to a germanium donor substrate on which a silicon oxide layer has been deposited.

One particular variant of the process according to the invention will now be described with reference to FIGS. 3A to 3C. This variant corresponds to additional steps applied after one or other of the two aforementioned processes that make it possible to obtain the hybrid substrates 6 or 6'. For simplification, this process as shown in FIGS. 3A to 3C has been applied only to a substrate 6. This variant applies to the particular case in which the material constituting the insulator of the first and second layers 2 and 3 is an oxide of the semiconductor material constituting the active layer 14 and in which the active layer 14 has a predetermined thickness, as will be described below.

These additional steps have the purpose of thinning the insulating oxide layers 2 and 3 so as to form a hybrid substrate 60 of the UTBox type, as shown in FIG. 3B or a substrate 600 of the DSB type, as shown in FIG. 3C. UTBox is the acronym for the expression "Ultra Thin Buried Oxide", which denotes substrates of the SOI type in which the buried oxide layer has a thickness of 50 nm (50 nanometers) or less, or even less than 25 nm. DSB is the acronym for the expression "Direct Semiconductor Bonding", which denotes a substrate comprising an active layer of semiconductor material directly in contact with the semiconductor receiver substrate.

To obtain such substrates, the active layer 14 of the hybrid substrate 6 (see FIG. 3A) must have a thickness between 25 and 500 nanometers, preferably between 25 and 250 nanometers and even more preferably between 25 and 120 nanometers, and the sum of the thicknesses of the oxide layers 2 and 3 must be between 1 and 100 nanometers, preferably between 1 and 50 nanometers. A heat treatment is carried out so that the thickness of the oxide layer 2, 3 decreases, by diffusion of oxygen through the active layer 14. This heat treatment is carried out in an inert and/or reducing atmosphere, such as an atmosphere containing argon or hydrogen, or a mixture of the two.

To illustrate the reduction in thickness of the oxide due to the diffusion of oxygen, FIG. 3A shows an axis x that extends perpendicular to the plane of the layers of the hybrid substrate 6, the origin O of which is at the center of the oxide layer and on which the positive values are directed toward the active layer 14 and the negative values toward the receiver substrate 5. The substrate 6 has two diffusion regions, namely diffusion through the active layer 14 and through the bulk receiver substrate 5, these two regions being separated by the oxide layers 2, 3, the overall thickness of which is $d_{ox}$. Assuming that the diffusion of oxygen takes place in one dimension, the diffusion equation is then:

$$\frac{\partial C(x,t)}{\partial t} = D(T)\frac{\partial^2 C(x,t)}{\partial x^2}$$

in which C(x,t) is the oxygen concentration at a time t and at a point x, and D(T) is the oxygen diffusion coefficient (in units of $cm^2/s$) in the semiconductor material. The rate of dissolution of oxide corresponds to the difference between the oxygen flux passing through the active layer 14 and the oxygen flux passing through the receiver substrate 5 at the interfaces with the oxides 2 and 3.

If the active layer 14 is thin enough, some of the oxygen of the oxide layers 2 and 3 diffuses through it and evaporates into the atmosphere on its surface. This diffusion is accelerated by the fact that the atmosphere in which the reaction takes place is inert, or more precisely non-oxidizing. In particular, the following reaction occurs at the surface of the active layer 14 if the inert atmosphere contains hydrogen and if the active layer 14 is silicon:

$SiO_2 + H_2 \rightarrow H_2O + SiO\uparrow$

Since the thickness of the receiver substrate 5 is very large, the oxygen present in the oxide layers 2 and 3 cannot reach the free surface of the substrate 5, namely the rear surface 51.

However, a certain quantity of oxygen may be present within the receiver substrate 5 and this oxygen will diffuse toward the oxide layers 2 and 3. There is therefore a competition between diffusion through the active layer 14 and that resulting from the displacement of oxygen from the receiver substrate 5 toward the oxide layers 2 and 3. It has now been found that if the active layer 14 is thin enough and if the atmosphere in which the heat treatment takes place is inert and/or reducing, even if the thickness of the oxide layers 2 and 3 temporarily increases slightly owing to the supply of oxygen coming from the substrate 5, typically after a few seconds of treatment, the oxygen present in the oxide layers 2 and 3 starts to dissolve, so that the thickness of these layers decreases.

After a certain time and if the thickness of the active layer 14 is small, the diffusion of oxygen coming from the receiver substrate 5 may be considered to be negligible. Under these conditions, the stabilized oxygen flux F is such that:

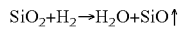
$F = D(T) \times C_0(T)/d_{Se}$ where $d_{Se}$ is the thickness of the active layer 14 and $C_0(T)$ is the equilibrium solubility of oxygen in the semiconductor at the annealing temperature. The oxide dissolution time, which allows the oxide layers 2, 3 of thickness $d_{ox}$ to be reduced by a predetermined value $\Delta d_{ox}$ is:

$$\text{time} = \frac{d_{Se} \times \Delta d_{ox}}{D(T) \times C(T)} \times N,$$

in which formula, N is the concentration of atomic oxygen in the oxide and C(T) is the solubility coefficient of oxygen in silicon as a function of the temperature.

To give an example, if the active layer 14 of semiconductor material is made of single-crystal silicon, then $N=4.22\times10^{22}$ and if the oxide layers 2 and 3 are made of silicon dioxide ($SiO_2$) and if $d_{Se}=100$ nanometers and $\Delta d_{ox}=2$ nanometers, then the time is $1.86\times10^{-12}\times e^{(4.04eV/kT)}$, k representing Boltzmann's constant and T the temperature in kelvin. It has now been demonstrated that the main parameters affecting the dissolution time are the annealing temperature and the thickness of the active layer 14 and that moreover the result does not depend on the oxygen concentration in the receiver substrate 5. In general the temperature and duration of the heat treatment, and also the thickness of the oxide layers 2 and 3 and the thickness of the active layer 14, will be chosen so as to incite oxygen present in the oxide layers 2 and 3 to diffuse through the active layer 14, rather than through the receiver substrate 5.

To give an illustrative example, and on the basis of a simulation, the minimum annealing conditions, in an atmosphere containing argon and/or hydrogen, allowing an $SiO_2$ layer 2 nanometers in thickness with a silicon active layer 14 100 nanometers in thickness to dissolve, are the following:

1100° C. for 2 hours; or
1200° C. for 10 minutes; or
1250° C. for 4 minutes.

In addition, the thickness of the active layer 14 and the heat treatment temperature determine the average rate of reduction of the oxide layers 2 and 3. The greater the thickness of the layer 14, the lower the rate of reduction of the thickness of the layers 2 and 3. The higher the temperature, the more rapid the dissolution of the layers 2 and 3. Advantageously, the thickness of the active layer 14 and the temperature will be predetermined so as to have an average rate of reduction of the oxide layers 2 and 3 of at least about 0.05 nanometers/min. For this purpose, a temperature of 1200° C. and a thickness of the single-crystal silicon active layer 14 of less than 250 nanometers will then be chosen.

FIG. 3B illustrates the hybrid substrate 60 of the UTBox type obtained after diffusion of oxygen through the active layer 14. This layer is thicker and bears the reference 14', while the oxide layers 2 and 3 are shown by a single thinner layer referenced 8. Finally, as illustrated in FIG. 3C, the treatment may also be continued at temperatures and for durations such that the oxide layers 2 and 3 completely disappear so that the DSB substrate 600, with an even thicker active layer than the layer 14', and bearing the numerical reference 14", is obtained.

What is claimed is:
1. A process for reducing defects on an active layer that is transferred during fabricating of a hybrid substrate, which process comprises providing a first insulator layer on a first substrate of semiconductor material, the layer having an exposed surface; forming a roughened surface on the first insulator layer; providing a second insulator layer of semiconductor material on the roughened surface of the first insulator layer to form a trapping zone at an interface between the layers; bonding a second substrate onto the second insulator layer by molecular adhesion, wherein one of the substrates includes a zone of weakness therein formed by implantation of atomic species and defining an active layer; and transferring the active layer by detachment at the zone of weakness to form the hybrid substrate, wherein the roughened surface of the first substrate forms a trapping zone that is capable of retaining gaseous atomic species present at the interface of the layers to reduce formation of defects on the surface of the active layer that is transferred.

2. The process of claim 1, wherein the roughened surface is formed to have a minimum RMS roughness of at least 10 nm over a scan area measuring 40 μm×40 μm and wherein the first insulator layer is formed or deposited so as to have a thickness at least equal to 10 times the value of this minimum roughness.

3. The process of claim 1, wherein the roughened surface is formed by chemical etching.

4. The process of claim 3, wherein the chemical etching is carried out using a standard cleaning solution 1 comprising a mixture of ammonium hydroxide, hydrogen peroxide and deionized water.

5. The process of claim 3, wherein the etching is carried out using a solution of hydrofluoric acid.

6. The process of claim 1, wherein the roughened surface is formed by treatment in a gas plasma containing at least one of the following gases selected from $C_xF_y$, $S_xF_y$, $C_xH_y$, carbon monoxide, hydrogen, argon, a chlorinated boron species or mixtures thereof, and optionally with oxygen or nitrogen, so as to create partial polymerization reactions on that surface.

7. The process of claim 6, wherein the plasma has a density of between about $10_7$ at/cm$^3$ and $10^{13}$ at/cm$^3$.

8. The process of claim 1, which further comprises densifying the second insulator layer by a heat treatment at least 800° C. for at least one hour.

9. A process for reducing defects on an active layer that is transferred during fabricating of a hybrid substrate, which process comprises providing a first insulator layer on a first substrate of semiconductor material, the layer having an exposed surface; forming a roughened surface on the first insulator layer; forming a trapping zone by providing a second insulator layer of semiconductor material on the roughened surface of the first insulator layer with the trapping zone provided at an interface between the first and second insulator layers; bonding a second substrate onto the second insulator layer by molecular adhesion, wherein one of the substrates includes a zone of weakness therein formed by implantation of atomic species and defining an active layer; and transferring the active layer by detachment at the zone of weakness to form the hybrid substrate, wherein the roughened surface of the first substrate forms a trapping zone that is capable of retaining gaseous atomic species present at the interface of the layers to reduce formation of defects on the surface of the active layer that is transferred, wherein the first substrate is a donor wafer that includes the active layer and the providing of the first insulator layer is achieved by forming or depositing the layer upon the donor wafer and the implanting of atomic species is carried out after the first insulator layer has been deposited or formed on the donor wafer, with the roughening taking place before or after the implanting.

10. The process of claim 9, wherein the implanting of atomic species is carried out after the second insulator layer has been provided.

11. The process of claim 1, wherein the first or second insulating layer or both is an oxide.

12. The process of claim 11, wherein the oxide of the first insulator layer is obtained by thermal oxidation of the first substrate, or is a native oxide.

13. The process of claim 11, wherein the oxide of the first or second insulator layer is a silicon oxide obtained by low-pressure chemical vapor deposition of a tetraethylorthosilicate.

14. The process of claim 11, wherein the oxide of the first or second insulator layer is provided by chemical vapor deposition or low-pressure chemical vapor deposition.

15. The process of claim 1, wherein the first or second insulator layer, or both, is a nitride.

16. The process of claim 1, wherein the first or second insulator layer, or both, is an oxide of the semiconductor material of the active layer, wherein the active layer has a predetermined thickness and wherein, after transferring the active layer, the hybrid substrate is heated in an inert or reducing atmosphere at a predetermined temperature for a predetermined time sufficient to diffuse oxygen from the oxide layer through the active layer to reduce the thickness of the oxide layer.

17. The process of claim 16, wherein the active layer has a thickness of between about 25 nanometers and about 500 nanometers, the predetermined temperature is about 1200° C. and the predetermined time is between 5 minutes and 5 hours.

18. The process of claim 16, wherein the first and second insulator layers have a total thickness of between 1 nm and 50 nm.

19. The process of claim 16, wherein the predetermined thickness of the active layer and the predetermined temperature are chosen so as to have an average rate of reduction of the oxide layers of about 0.05 nm per minute.

20. The process of claim 16, wherein the heating is continued until the first and second oxide layers have been completely removed.

21. The process of claim 1, wherein the first and second insulator layers are silicon oxide and wherein the first and second substrates are made of silicon.

22. The process of claim 1, wherein the first and second substrates are made of germanium, gallium nitride, gallium arsenide or silicon-germanium.

23. The process of claim 22, wherein the first or second insulator layers, or both, is made of silicon oxide, silicon nitride, germanium oxynitride, or of hafnium dioxide, alumina, zirconium oxide, tantalum pentoxide, titanium dioxide, or one of their nitrides or silicides.

24. The process of claim 1, wherein the first or second insulator layers, or both, is made of germanium oxynitride, or of hafnium dioxide, alumina, zirconium oxide, tantalum pentoxide, titanium dioxide, or one of their nitrides or silicides.

* * * * *

UNITED STATES PATENT AND TRADEMARK OFFICE
CERTIFICATE OF CORRECTION

PATENT NO.         : 7,632,739 B2                                              Page 1 of 1
APPLICATION NO.    : 11/836527
DATED              : December 15, 2009
INVENTOR(S)        : Hebras It is certified that error appears in the above-identified patent and that said Letters Patent is hereby corrected as shown below:

Column 13:
Line 35 (claim 7, line 2), change "$10_7$" to -- $10^7$ --.

Signed and Sealed this

Twelfth Day of January, 2010

David J. Kappos
*Director of the United States Patent and Trademark Office*